United States Patent
Wei et al.

(10) Patent No.: US 10,971,213 B1
(45) Date of Patent: Apr. 6, 2021

(54) DATA SENSING DEVICE AND DATA SENSING METHOD THEREOF

(71) Applicant: MACRONIX International Co., Ltd., Hsinchu (TW)

(72) Inventors: Ming-Liang Wei, Kaohsiung (TW); Zu-Heng Liu, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/581,565

(22) Filed: Sep. 24, 2019

(51) Int. Cl.
*G11C 11/34* (2006.01)
*G11C 16/06* (2006.01)
*G11C 11/4091* (2006.01)
*G11C 5/02* (2006.01)
*G11C 5/14* (2006.01)
*G11C 11/408* (2006.01)

(52) U.S. Cl.
CPC .......... *G11C 11/4091* (2013.01); *G11C 5/02* (2013.01); *G11C 5/147* (2013.01); *G11C 11/4087* (2013.01)

(58) Field of Classification Search
CPC ... G11C 11/4091; G11C 11/4087; G11C 5/02; G11C 5/147
See application file for complete search history.

(56) References Cited

U.S. PATENT DOCUMENTS

| | | | |
|---|---|---|---|
| 6,807,101 B2 | 10/2004 | Ooishi et al. | |
| 7,173,854 B2 | 2/2007 | Cernea et al. | |
| 7,391,645 B2 | 6/2008 | Cernea et al. | |
| 2003/0169622 A1 | 9/2003 | Ooishi et al. | |
| 2005/0141277 A1* | 6/2005 | Furuyama | G11C 16/28 365/185.18 |
| 2006/0221693 A1 | 10/2006 | Cernea et al. | |
| 2007/0115721 A1 | 5/2007 | Cernea et al. | |
| 2012/0069638 A1 | 3/2012 | Matsuda et al. | |
| 2016/0093372 A1* | 3/2016 | Fainzilber | G11C 29/52 714/764 |
| 2019/0295621 A1* | 9/2019 | Ikegami | H01L 43/02 |
| 2019/0295669 A1* | 9/2019 | Yang | G11C 16/08 |

FOREIGN PATENT DOCUMENTS

| | | |
|---|---|---|
| TW | 200707442 | 2/2007 |
| TW | 200842880 | 11/2008 |

OTHER PUBLICATIONS

"Office Action of Taiwan Counterpart Application," dated Dec. 17, 2019, p.1-p.5.

* cited by examiner

*Primary Examiner* — Toan K Le
(74) *Attorney, Agent, or Firm* — J.C. Patents

(57) ABSTRACT

A data sensing device and a data sensing method are provided. The data sensing device includes a current adjuster and a sensing amplifier. The current adjuster corresponds to a memory string of a memory array, generates a shift current according to an amount of a plurality of input signals of the memory string, and generates an adjusted read-out current by adjusting a read-out current of the memory string according to the shift current. The sensing amplifier receives the adjusted read-out current and a plurality of reference currents, and generates a read-out data by comparing the adjusted read-out current and the plurality of reference currents.

13 Claims, 10 Drawing Sheets

DATA SENSING DEVICE AND DATA SENSING METHOD THEREOF

BACKGROUND

Technical Field

The invention relates to a data sensing device and a data sensing method thereof, and particularly relates to a data sensing device suitable for neural network computation and a data sensing method thereof.

Description of Related Art

Along with evolution of electronic technology, artificial intelligence technology has gradually become a mainstream, and a neural network is an important way to perform artificial intelligence computations.

The neural network is subject to a large amount of computations. In the conventional technical field, the neural network computation is often performed through a digital circuit or a high-order processor. Such approach requires relatively high hardware cost and requires relatively high power to execute the computations. Therefore, the conventional techniques perform the neural network computations through a non-volatile memory, which may effectively reduce a circuit area and reduce required power consumption.

In the conventional technical field, transconductances of memory cells in the non-volatile memory may be provided as weights in the neural network. By multiplying input signals received by the memory cells with the transconductances of the memory cells, the computation of the neural network may be realized.

It should be noted that the weights in the neural network may be positive values, negative values or 0. However, the memory cells of the non-volatile memory cannot provide the transconductances of the negative values. Therefore, in the conventional technique, the weights are all added by a predetermined shift value, such that the values of all of the weights become positive values to implement the computations. FIG. 1 is a relationship diagram of a read-out current of a memory string and an input signal amount according to the conventional technique. A distribution range of the read-out current of the memory string is varied along with a magnitude of the input signal amount SX. In FIG. 1, when the input signal amount SX is respectively 5, 6 and 7, the distribution range of the read-out current serving as a reference range (with a weight of 0) is also different. Therefore, in order to effectively sense read-out data corresponding to the read-out current, the conventional technique requires to provide a plurality of reference currents for the possible input signal amount SX in advance. Therefore, a reference current generating circuit with a large area is required, and power consumption is increased.

SUMMARY

The invention is directed to a data sensing device and a data sensing method thereof, which are adapted to reduce an amount of required reference currents.

The invention provides a data sensing device including a current adjuster and a sensing amplifier. The current adjuster corresponds to a memory string of a memory array, generates a shift current according to an amount of a plurality of input signals of the memory string, and adjust a read-out current of the memory string according to the shift current to generate an adjusted read-out current. The sensing amplifier is coupled to the current adjuster, receives the adjusted read-out current and a plurality of reference currents, and compares the adjusted read-out current and the plurality of reference currents to generate a read-out data.

The invention provides a data sensing method including: providing a current adjustor corresponding to a memory string of a memory array, and generating a shift current by the current adjuster according to an amount of a plurality of input signals of the memory string; adjusting a read-out current of the memory string by the current adjuster according to the shift current to generate an adjusted read-out current; and providing a sensing amplifier to compare the adjusted read-out current and a plurality of reference currents to generate a read-out data.

Based on the above description, in the invention, the current adjuster adjusts the read-out current of the memory string according to the amount of the input signals of the memory string. In this way, when the amount of the input signals of the memory string is varied, the data sensing device of the invention performs a sensing operation of the read-out data through a predetermined number of the reference currents without configuring excessive reference currents, which may effectively save a circuit area and power consumption of the data sensing device.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
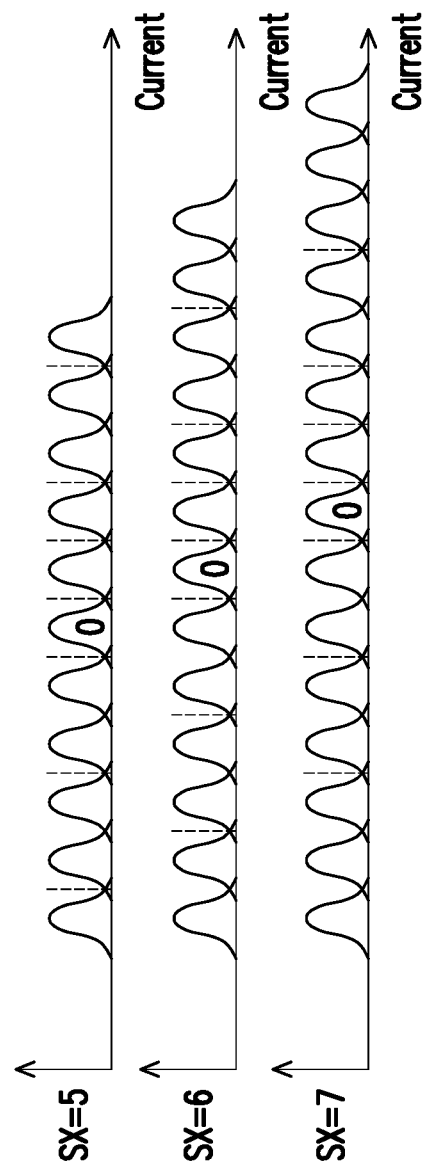
FIG. 1 is a relationship diagram of a read-out current of a memory string and an input signal amount according to the conventional technique.
Figure 2:
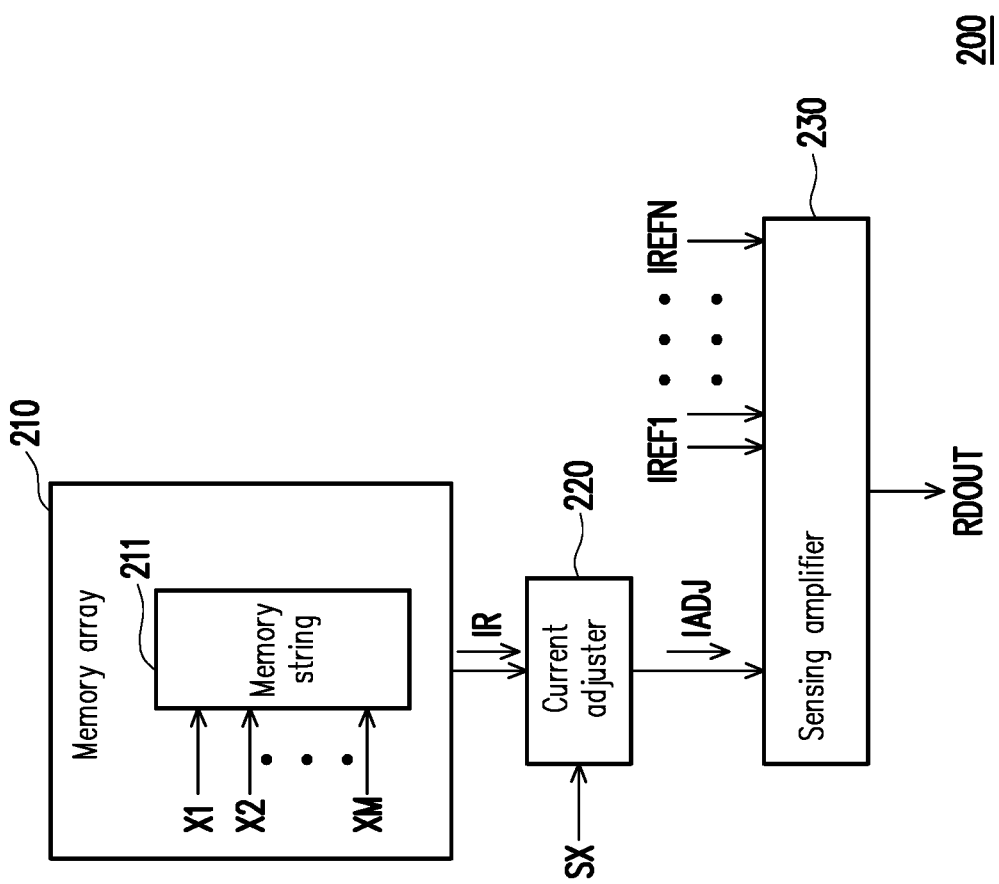
FIG. 2 is a schematic diagram of a data sensing device according to an embodiment of the invention.

Referring to FIG. 2, FIG. 2 is a schematic diagram of a data sensing device according to an embodiment of the invention. The data sensing device 200 includes a memory array 210, and the memory array 210 includes one or a plurality of memory strings 211. The data sensing device 200 includes a current adjuster 220 and a sensing amplifier 230. The current adjuster 220 corresponds to the memory string 211 in the memory array 210, and generates a shift current according to an amount SX of a plurality of input signals X1-XM of the memory string 211. Moreover, the current adjuster 220 receives a read-out current IR generated by the memory array 210 according to the input signals X1-XM, and adjusts the read-out current IR according to the shift current to generate an adjusted read-out current IADJ. The current adjuster 220 provides the adjusted read-out current IADJ to the sensing amplifier 230.

In the embodiment, the sensing amplifier 230 receives the adjusted read-out current IADJ and a plurality of reference currents IREF1-IREFN. The sensing amplifier 230 compares the adjusted read-out current IADJ with the plurality of reference currents IREF1-IREFN to generate a read-out data RDOUT. It should be noted that in the embodiment, a number of the reference currents IREF1-IREFN may be non-related to the amount SX of the input signals X1-XM.

In detail, the current adjuster 220 may determine whether to generate the shift current by determining whether the amount SX of the input signals X1-XM is greater than a predetermine reference value or not. The current adjustor 220 may generate the shift current to adjust the read-out current IR when the amount SX of the input signals X1-XM is greater than the predetermine reference value. Comparatively, when the amount SX of the input signals X1-XM is not greater than the predetermine reference value, the current adjuster 220 is unnecessary to generate the shift current used for adjusting the read-out current IR. In generation detail of the adjusted read-out current IADJ, the current adjuster 220 may perform an arithmetic operation on the read-out current IR and the shift current to generate the adjusted read-out current IADJ, for example, the adjusted read-out current IADJ may be equal to the read-out current IR minus the shift current.

Figure 3:
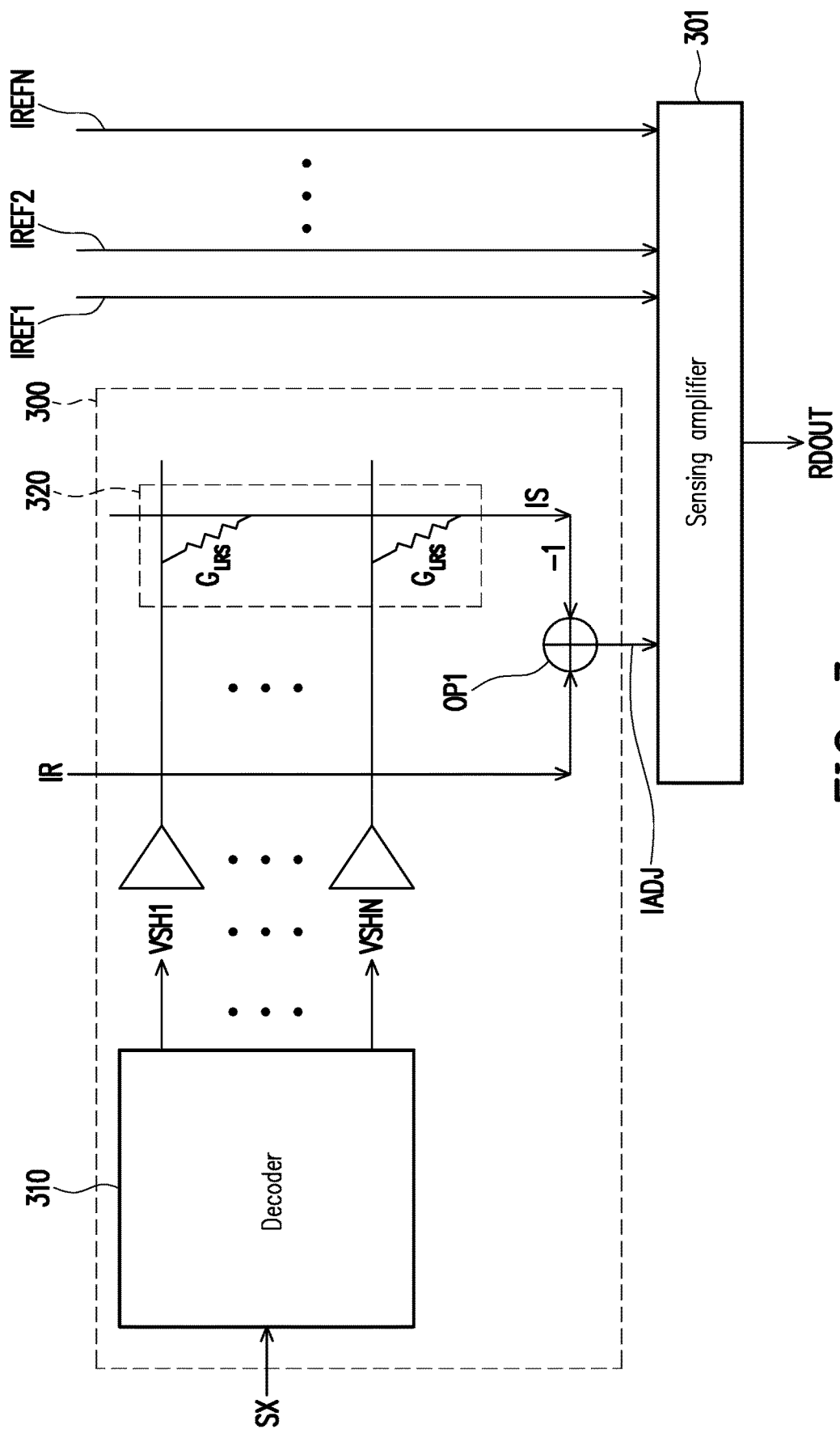
FIG. 3 is an implementation of a current adjuster according to an embodiment of the invention.

Referring to FIG. 3, FIG. 3 is an implementation of a current adjuster according to an embodiment of the invention. The current adjuster 300 includes a decoder 310, a current generator 320 and operator OP1. The decoder 310 decodes a value of the amount SX of the input signals of the memory string to generate a plurality of control signals VSH1-VSHN. The current generator 320 is coupled to the decoder 310 to receive the control signals VSH1-VSHN, and generates a shift current IS according to an amount of enabled control signals VSH1-VSHN. The operator OP1 receives the read-out current IR provided by the memory string and the shift current IS, and generates the adjusted read-out current IADJ by subtracting the shift current IS from the read-out current IR.

In detail, the decoder 310 may determine the amount of the enabled control signals VSH1-VSHN according to the amount SX of the input signals, the current generator 320 may adjust a magnitude of the generated shift current IS according to the amount SX of the input signals. It should be noted that when the amount SX of the input signals is not greater than the aforementioned predetermined value, none of the control signals VSH1-VSHN is enabled.

The enabled control signals VSH1-VSHN may be a logic level 1 or a logic level 0, which may be set by a designer according to an actual circuit state, and is not limited by the invention.

It should be noted that the current generator 320 may be configured by using a plurality of non-volatile memory cells. The non-volatile memory cells are arranged into a memory string, and respectively provide a plurality of transconductances $G_{LRS}$. The current generator 320 may apply voltages to the non-volatile memory cells according to the enabled control signals VSH1-VSHN, and generate the shift current IS according to the transconductances $G_{LRS}$.

In the embodiment, the current adjuster 300 is coupled to a sensing amplifier 301. The sensing amplifier 301 may compare the adjusted read-out current IADJ and the reference currents IREF1-IREFN to generate the read-out data RDOUT. Moreover, the operator OP1 may be any subtractor (or adder) circuit well known by those skilled in the art, which is not limited by the invention.

Figure 4:
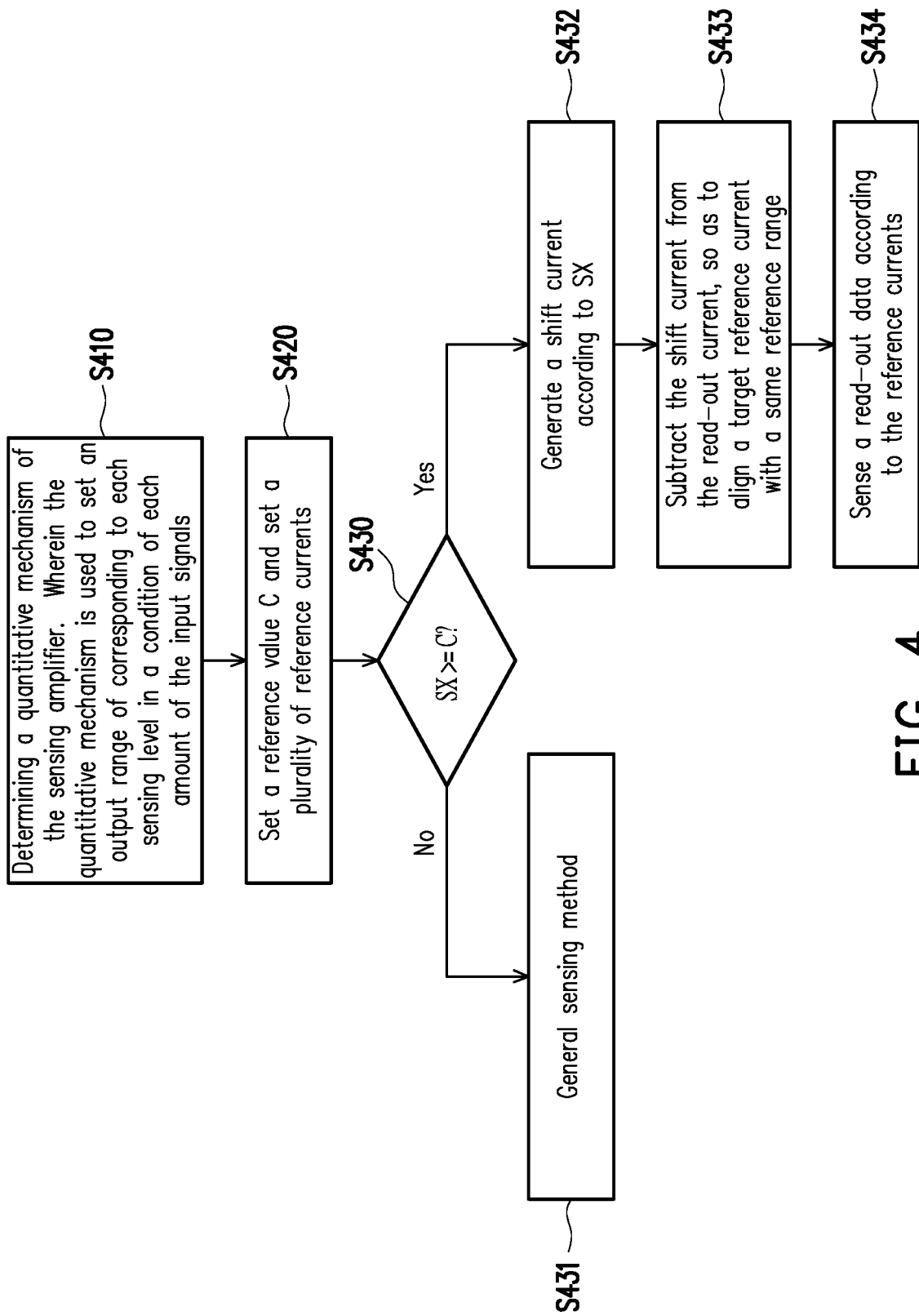
FIG. 4 is a flowchart illustrating a data sensing method according to the implementation of FIG. 3.

Referring to FIG. 4, FIG. 4 is a flowchart illustrating a data sensing method according to the implementation of FIG. 3. Regarding the current adjuster 300 of FIG. 3, in a step S410, a quantitative mechanism of the sensing amplifier 301 is determined. Since a sensing level of the sensing amplifier 301 is limited in number, not all of output values of the neural network can be sensed. Therefore, the quantitative mechanism is used to set an output range of corresponding to each sensing level in a condition of each amount SX of the input signals. A reference value C and reference currents are set in a step S420. Wherein, when the amount SX of the input signals is smaller or equal to the reference value C, values of the reference currents may be different on different condition (the amount SX). When the amount SX of the input signals is larger than the reference value C, the values of the reference currents are equal to the values of the reference currents when the amount SX of the input signals is equal to the reference value C. Such as that, it is necessary to set the reference currents IREF1-IREFN under all conditions of the amount SX of the input signals smaller than or equal to the reference value C. The reference currents IREF1-IREFN are provided to the sensing amplifier 301, and the reference value C may be stored in the current adjustor 300.

Then, in a step S430, the current adjustor 300 compares the amount SX of the input signals with the reference value C, and when the amount SX of the input signals is greater than or equal to the reference value C, a step S432 is executed, and when the amount SX of the input signals is smaller than the reference value C, a step S431 is executed.

When the amount SX of the input signals is smaller than the reference value C, in the step S431, a general sensing method is executed, i.e. the read-out current IR of the memory string is directly transmitted to the sensing amplifier 301, and the sensing amplifier 301 compares the read-out current IR with the reference currents IREF1-IREFN to generate the read-out data RDOUT.

Comparatively, when the amount SX of the input signals is greater than or equal to the reference value C, in the step S432, the decoder 310 may decode the amount SX of the input signals, and the current generator 320 generates the shift current IS according to a decoding result. Then, in a step S433, the operator OP1 subtracts the shift current IS from the read-out current IR to align a target reference current with a same reference range. The target reference current is the read-out current IR in a condition that the mount SX of the input signals is equal to the reference value C and the corresponding memory string is in a zero weighting. Though the operation of the step S433, regardless of the value of the amount SX (for example, greater than or equal to the reference value C) of the input signals, the read-out current IR in the condition that the mount SX of the input signals is equal to the reference value C and the corresponding memory string is in a zero weighting may be aligned to the same reference range.

Figure 5:
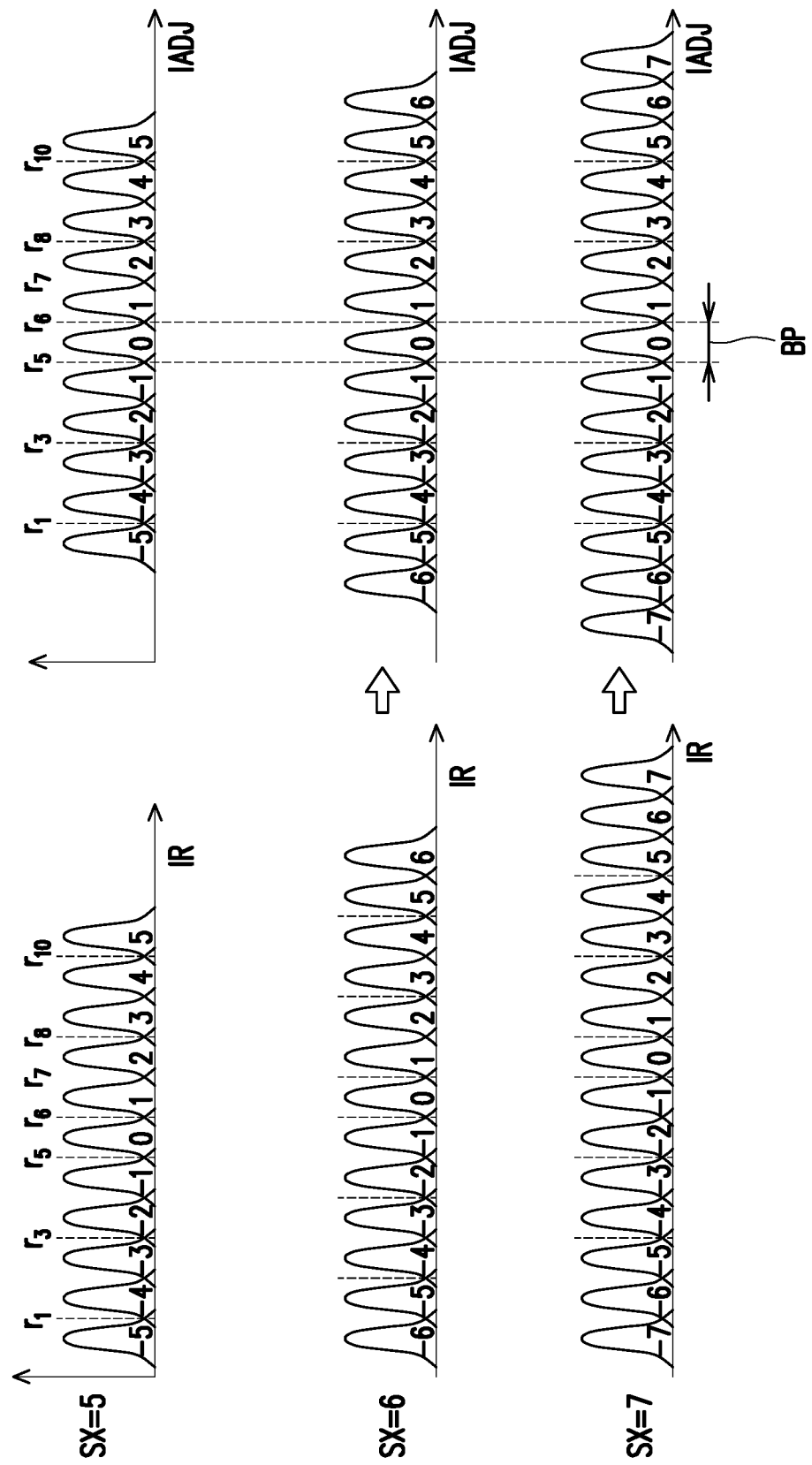
FIG. 5 is a schematic diagram of distribution ranges of an adjusted read-out current corresponding to different amounts of the input signals in the implementation of FIG. 4.

Referring to FIG. 5, FIG. 5 is a schematic diagram of distribution ranges of the adjusted read-out current corresponding to different amounts of the input signals in the implementation of FIG. 4. In FIG. 5, the reference value C is, for example, equal to 5, and FIG. 5 respectively illustrates the distribution ranges of the read-out current IR when the amount SX of the input signals is equal 5, 6 and 7. Based on the different amounts of the input signals, in the zero weighting condition, the distribution range of the read-out current IR is not aligned with the reference range. After the adjusting operation of the shift current, in the distribution ranges of the adjusted read-out current IADJ when the amount SX is equal 5, 6 and 7, the distribution range of the reference current in the zero weight condition may be aligned to a same reference range BP. In this way, the adjusted read-out currents IADJ corresponding to the amount SX of 5, 6 and 7 may all be compared with predetermined reference currents $r_1$, $r_3$, $r_5$, $r_6$, $r_7$, $r_8$ and no to generate the read-out data RDOUT.

Figure 6:
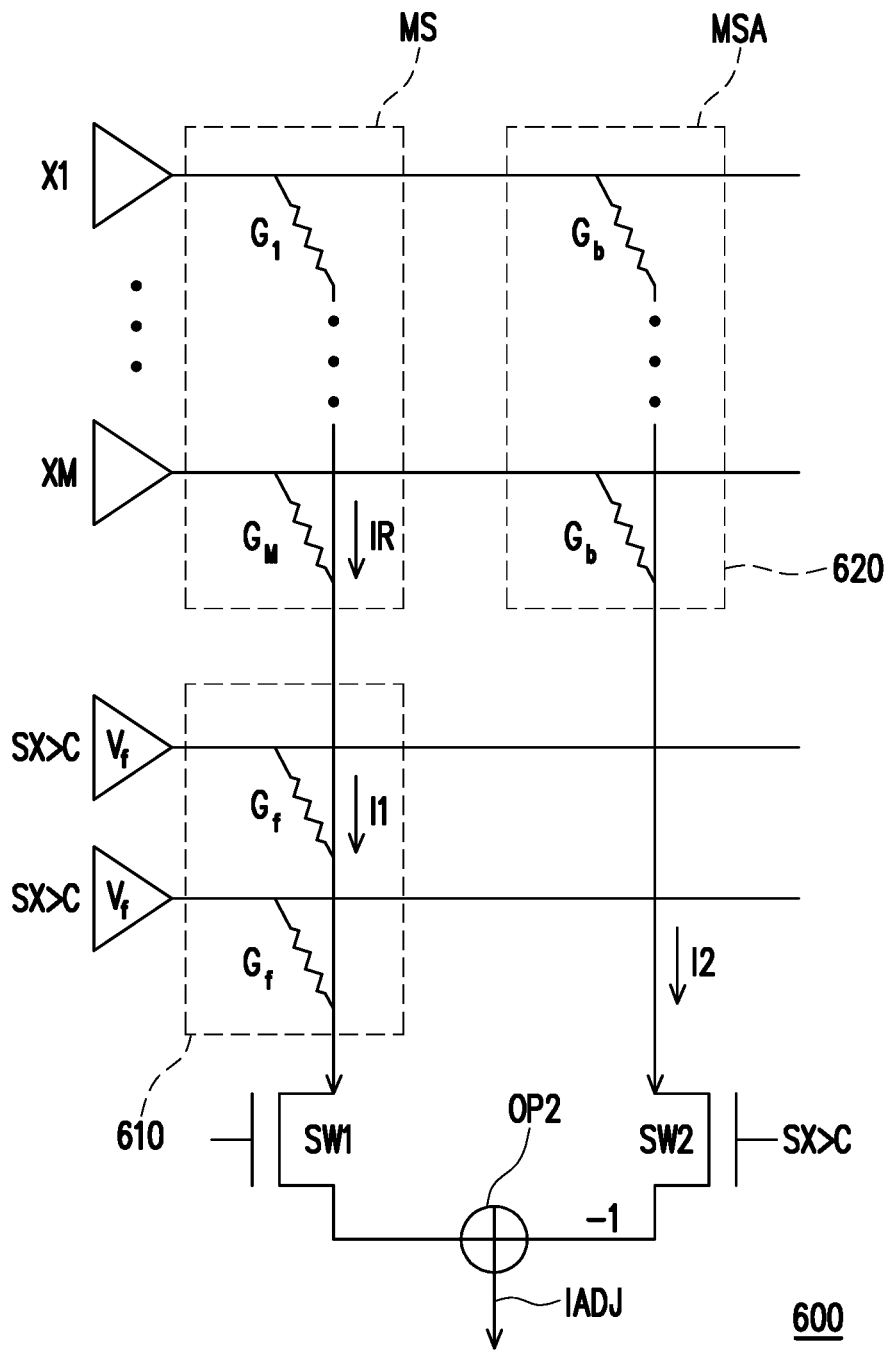
FIG. 6 is an implementation of a current adjuster according to an embodiment of the invention.

Referring to FIG. 6, FIG. 6 is an implementation of a current adjuster according to an embodiment of the invention. The current adjuster 600 includes current generators 610 and 620, switches SW1 and SW2, and an operator OP2. The current generator 610 is coupled in series with a memory string MS. The memory string MS receives the input signals X1-XM, and generates the read-out current IR according to transconductances $G_1$-$G_M$ respectively provided by a plurality of memory cells on the memory string MS. The current generator 610 is turned on when the amount SX of the input signals X1-XM is greater than the predetermined value C. The current generator 610 has a plurality of memory cells, and generates a first current I1 according to a bias Vf applied to the memory cells through the respectively provided transconductance $G_f$. Based on that the memory string MS, the current generator 610 and the switch SW1 are connected in series, a current received by the switch SW1 may be equal to a sum of the first current I1 and the read-out current IR.

On the other hand, the current generator 620 and the switch SW2 are connected in series. The current generator 620 is composed of another memory string MSA, and has a plurality of memory cells. The memory cells of the memory string MSA provide a transconductance $G_b$, and generates a second current I2 according to the input signals X1-XM. The second switch SW2 is turned on according to a determination result of whether the amount SX of the input signals X1-XM is greater than the predetermined value C, and when the amount SX of the input signals X1-XM is greater than the predetermined value C, the second current I2 is transmitted to the operator OP2.

The operator OP2 is coupled to the switches SW1 and SW2, and when the switches SW1 and SW2 are all turned on, a sum of the first current I1 on the switch SW1 and the read-out current IR is subtracted by the second current I2 on the switch SW2 to generate the adjusted read-out current IADJ. In the embodiment, a difference of the first current I1 and the second current I2 may be equal to the shift current IS of the embodiment of FIG. 3.

It should be noted that the switch SW1 is constantly in a turn-on state when the data sensing operation is executed. The switches SW1 and SW2 may all be transistor switches. Moreover, the operator OP2 may be any subtractor (or adder) circuit well known by those skilled in the art, which is not limited by the invention.

Figure 7:
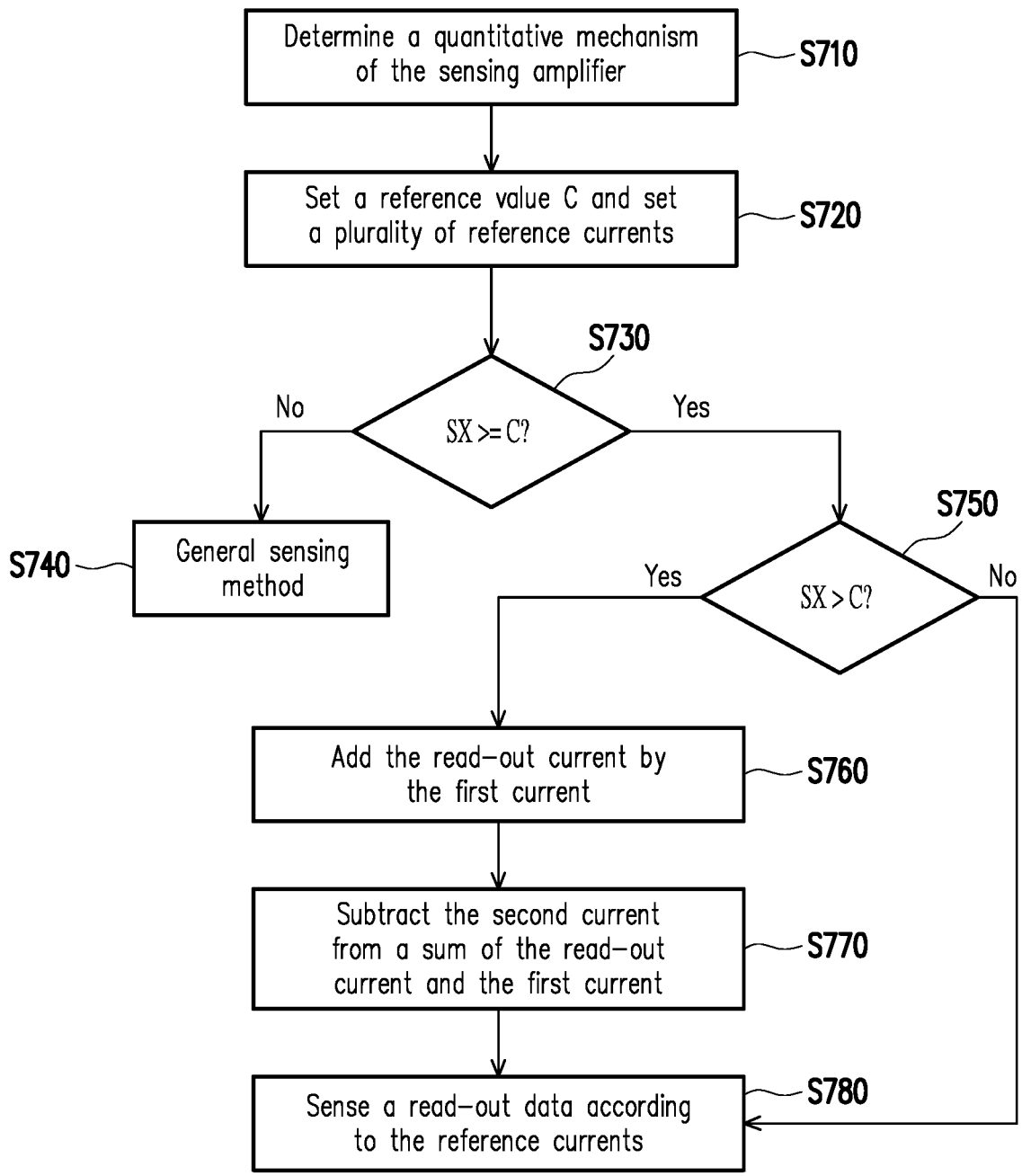
FIG. 7 is a flowchart illustrating a data sensing method of the implementation of FIG. 6.

Referring to FIG. 7, FIG. 7 is a flowchart illustrating a data sensing method of the implementation of FIG. 6. Regarding the current adjuster 600 of FIG. 6, in a step S710, a quantitative sensing mechanism of the sensing amplifier 301 is determined, where the quantitative sensing mechanism is used to set an output range of corresponding to each sensing level in a condition of each amount SX of the input signals. The reference value C and reference currents are set in a step S720, and as mentioned above, the reference currents are set according to all conditions when the mount SX of the input signals is smaller than or equal to the reference value C. The reference value C may be stored in the current adjustor 600.

Then, in a step S730, the current adjustor 300 compares the amount SX of the input signals with the reference value C, and when the amount SX of the input signals is greater than or equal to the reference value C, a step S750 is executed, and when the amount SX of the input signals is smaller than the reference value C, a step S740 is executed.

When the amount SX of the input signals is smaller than the reference value C, in the step S740, a general sensing method is executed, i.e. the read-out current IR of the memory string is directly transmitted to the sensing amplifier, and the sensing amplifier compares the read-out current IR with the reference currents to generate the read-out data.

Comparatively, when the amount SX of the input signals is greater than or equal to the reference value C, the step S750 is executed to determine whether the amount SX of the input signals is greater than the reference value C. When the amount SX of the input signals is greater than the reference value C, a step S760 is executed. Comparatively, when the amount SX of the input signals is smaller than or equal to the reference value C, a step S780 is directly executed.

In the step S760, the read-out current IR is added with the first current I1 generated by the current generator 610, and in a step S770, through the operator OP2 and the turned-on switch SW2, the second current I2 is subtracted from a sum of the read-out current IR and the first current I1 to generate the adjusted read-out current IADJ. Finally, in a step S780, the read-out data is generated according to the reference current.

Through the operation of the steps S760 and S770, by adding the read-out current with the first current I1 and subtracting the second current I2, regardless the value of the amount SX (for example, greater than the reference value C) of the input signals, the adjusted read-out current IADJ in a condition of zero weighting may be aligned to the same reference range.

Figure 8A:
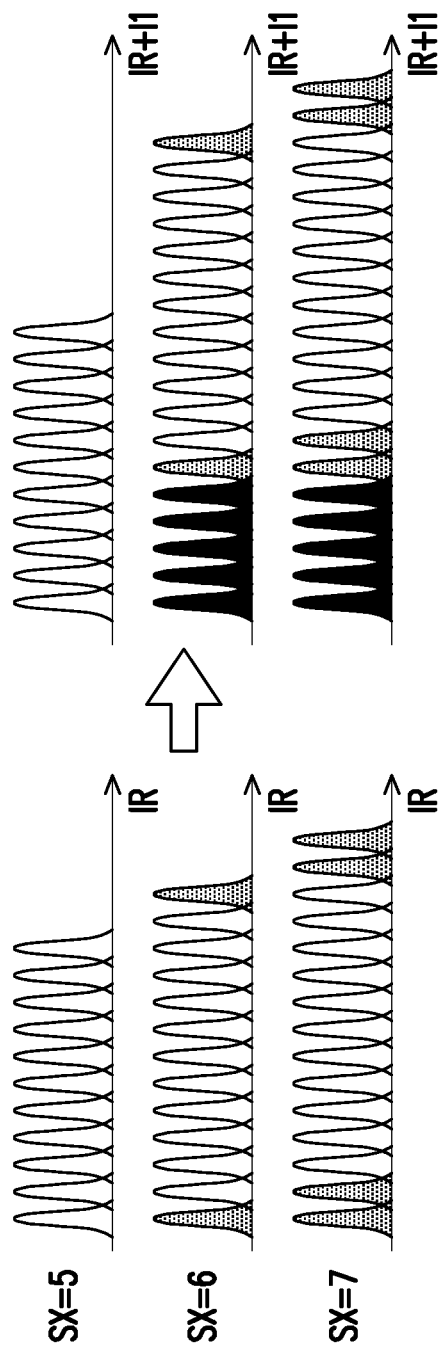
FIG. 8A and FIG. 8B are schematic diagrams of distribution ranges of the adjusted read-out current corresponding to different amounts of the input signals in the implementation of FIG. 7.
Figure 8B:
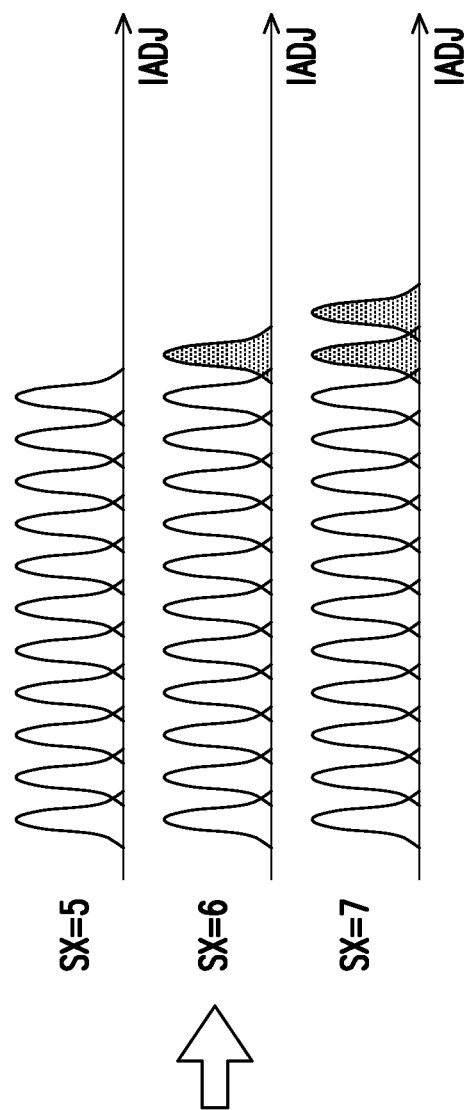

Referring to FIG. 8A and FIG. 8B, FIG. 8A and FIG. 8B are schematic diagrams of distribution ranges of the adjusted read-out current corresponding to different amounts of the input signals in the implementation of FIG. 7. In FIG. 8A, the reference value C is, for example, equal to 5, and FIG. 8A respectively illustrates the distribution ranges of the read-out current IR when the amount SX of the input signals is equal 5, 6 and 7. Based on the different amounts of the input signals, the distribution range of the read-out current IR in the zero weighting condition is not aligned with the reference range. After the first current I1 is added with the read-out current IR, a current distribution range of the first current I1 added with the read-out current IR may be adjusted first. Then, in FIG. 8B, the first current I1+the read-out current IR-the second current I2 to generate the adjusted read-out current IADJ. The distribution range of the adjusted read-out current IADJ may be aligned, and the read-out data may be sensed through the predetermined reference currents.

It should be noted that in the aforementioned embodiments, the transconductances provided by the memory cells and voltage values of the input signals may be set by the designer according to an actual requirement, which are not limited by the invention.

Figure 9:
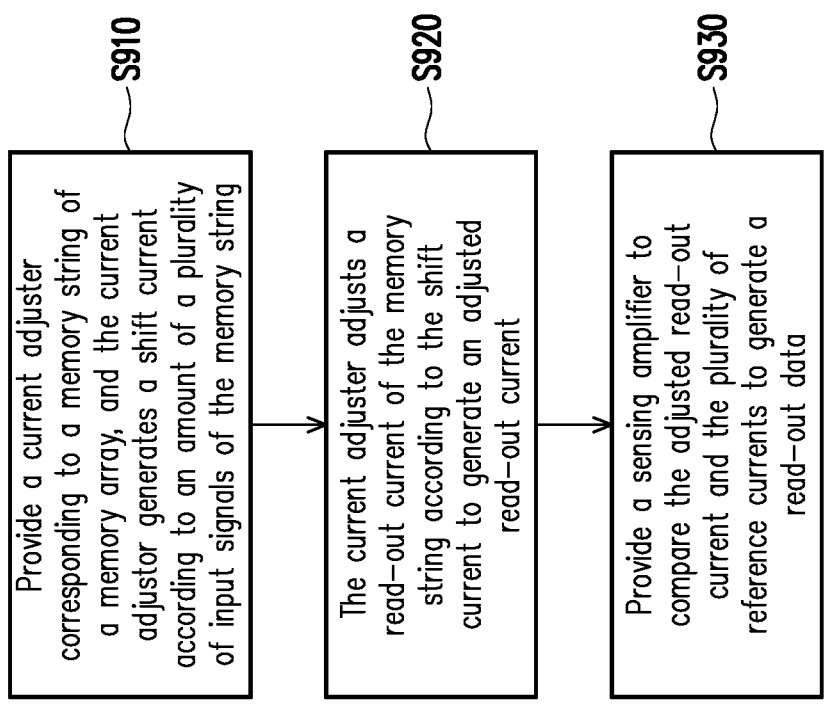
FIG. 9 is a flowchart illustrating a data sensing method according to an embodiment of the invention.

Referring to FIG. 9, FIG. 9 is a flowchart illustrating a data sensing method according to an embodiment of the invention. In a step S910, a current adjuster corresponding to a memory string of a memory array is provided, and the current adjustor generates a shift current according to an amount of a plurality of input signals of the memory string. In a step S920, the current adjuster adjusts a read-out current of the memory string according to the shift current to generate an adjusted read-out current. In a step S930, a sensing amplifier is provided to compare the adjusted read-out current and the plurality of reference currents to generate a read-out data.

Implementation details of the above steps have been described in a plurality of above embodiments and implementations, so that details thereof are not repeated.

In summary, in the invention, the shift current is provided to adjust the read-out current of the memory string. Then, the adjusted read-out current is compared with a plurality of reference currents to generate the read-out data. In this way, the data sensing device is unnecessary to generate a large amount of the reference currents in advance to cope with the different amounts of input signals. Therefore, the circuit cost and the required power consumption are effectively reduced.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A data sensing device, coupled to a memory array, and comprising:
   a current adjuster, corresponds to a memory string of a memory array, generating a shift current according to an amount of a plurality of input signals of the memory string compared to a predefined reference value, and adjusting a read-out current of the memory string according to the shift current to generate an adjusted read-out current; and
   a sensing amplifier, coupled to the current adjuster, receiving the adjusted read-out current and a plurality of reference currents, and comparing the adjusted read-out current and the plurality of reference currents to generate a read-out data.

2. The data sensing device as claimed in claim 1, wherein the current adjuster generates the shift current when the amount of the input signal is greater than a predetermined reference value, and adjusts the read-out current of the memory string according to the shift current to generate the adjusted read-out current.

3. The data sensing device as claimed in claim 2, wherein the current adjuster subtracts the shift current from the read-out current to generate the adjusted read-out current.

4. The data sensing device as claimed in claim 3, wherein the current adjuster comprises:
   a decoder, decoding a value of the amount of the input signals to generate a plurality of control signals;
   a current generator, receiving the control signals, and generating the shift current according to the control signals that are enabled; and
   an operator, subtracting the shift current from the read-out current to generate the adjusted read-out current.

5. The data sensing device as claimed in claim 4, wherein an amount of the enabled control signal is the same with the value of the amount of the input signals.

6. The data sensing device as claimed in claim 4, wherein the current generator comprises a plurality of non-volatile memory cells.

7. The data sensing device as claimed in claim 1, wherein the current adjuster generates a first current and a second current when the amount of the input signals is greater than a predetermined reference value, and generates the shift current according to the first current and the second current, and the current adjuster adjusts the read-out current of the memory string according to the shift current to generate the adjusted read-out current.

8. The data sensing device as claimed in claim 7, wherein the current adjuster subtracts the second current from the first current to generate the shift current, and adds the read-out current by the shift current to generate the adjusted read-out current.

9. The data sensing device as claimed in claim 7, wherein the current adjuster comprises:
   a first current generator, providing the first current when the amount of the input signals is greater than the predetermined reference value, and providing the first current to the memory string;
   a second current generator, generating the second current according to the input signals;
   a first switch, having a first terminal coupled to the first current generator and the memory string, and turned on or turned off according to a first control signal;
   a second switch, having a first terminal coupled to the second current generator, and turned on or turned off according to a second control signal; and
   an operator, coupled to a second terminal of the first switch and a second terminal of the second switch, and subtracting a current of the second terminal of the second switch from a current of the second terminal of the first switch to generate the adjusted read-out current.

10. The data sensing device as claimed in claim 9, wherein the second switch is turned on when the amount of the input signals is greater than the predetermined reference value.

11. A data sensing method, adapted to a memory array, and comprising:
    providing a current adjustor corresponding to a memory string of a memory array, and generating a shift current by the current adjuster according to an amount of a plurality of input signals of the memory string compared to a predefined reference value;
    adjusting a read-out current of the memory string by the current adjuster according to the shift current to generate an adjusted read-out current; and
    providing a sensing amplifier to compare the adjusted read-out current and a plurality of reference currents to generate a read-out data.

12. The data sensing method as claimed in claim 11, wherein the steps of generating the shift current by the current adjuster according to the amount of the plurality of input signals of the memory string and adjusting the read-out current of the memory string by the current adjuster according to the shift current to generate the adjusted read-out current comprises:
    generating the shift current when the amount of the input signals is greater than a predetermined reference value; and
    subtracting the shift current from the read-out current to generate the adjusted read-out current.

13. The data sensing method as claimed in claim 11, wherein the steps of generating the shift current by the current adjuster according to the amount of the plurality of input signals of the memory string and adjusting the read-out current of the memory string by the current adjuster according to the shift current to generate the adjusted read-out current comprises:

generating a first current and a second current when the amount of the input signals is greater than a predetermined reference value;

generating the shift current according to the first current and the second current; and subtracting the second current from the first current to generate the shift current, and adding the read-out current by the shift current to generate the adjusted read-out current.

* * * * *